(12) United States Patent  
Elferich

(10) Patent No.: US 12,185,438 B2  
(45) Date of Patent: Dec. 31, 2024

(54) RESONANT INVERTER AND CONVERSION METHOD

(71) Applicant: SIGNIFY HOLDING B.V., Eindhoven (NL)

(72) Inventor: Reinhold Elferich, Aachen (DE)

(73) Assignee: SIGNIFY HOLDING B.V., Eindhoven (NL)

( * ) Notice: Subject to any disclaimer, the term of this patent is extended or adjusted under 35 U.S.C. 154(b) by 260 days.

(21) Appl. No.: 17/795,760

(22) PCT Filed: Feb. 1, 2021

(86) PCT No.: PCT/EP2021/052231  
§ 371 (c)(1),  
(2) Date: Jul. 27, 2022

(87) PCT Pub. No.: WO2021/156162  
PCT Pub. Date: Aug. 12, 2021

(65) Prior Publication Data  
US 2023/0065763 A1 Mar. 2, 2023

(30) Foreign Application Priority Data

Feb. 4, 2020 (EP) .................................... 20155438

(51) Int. Cl.  
*H02M 7/48* (2007.01)  
*H02M 1/42* (2007.01)  
(Continued)

(52) U.S. Cl.  
CPC ........ *H05B 45/355* (2020.01); *H02M 1/4241* (2013.01); *H02M 7/4815* (2021.05);  
(Continued)

(58) Field of Classification Search  
CPC .............. H05B 45/355; H02M 1/4241; H02M 7/4815; H02M 7/537; H03L 7/093; H03L 7/099  
See application file for complete search history.

(56) References Cited

U.S. PATENT DOCUMENTS

| 10,680,510 B2 * | 6/2020 | Elferich | ................... H02M 3/01 |
| 2012/0106206 A1 * | 5/2012 | Tang | ................... H02M 3/3376 363/21.02 |
| 2017/0223792 A1 * | 8/2017 | Elferich | .............. H02M 1/4241 |

FOREIGN PATENT DOCUMENTS

| CN | 104426376 A | 3/2015 |
| EP | 2546968 A1 | 1/2013 |
| (Continued) | | |

*Primary Examiner* — Kyle J Moody

(57) ABSTRACT

A resonant inverter has a switch network from which a phase signal is provided representing the phase of the switching signal. A resonant tank circuit is coupled to the first switch network output and provides a feedback signal comprising a resonance voltage across a circuit element of the resonant tank circuit. A reference current to be drawn from the input node is set and a reference phase is set based on the reference current. The switching signal for the switch network is controlled based on a phase difference between the resonance voltage and the phase signal, and based on the reference phase. This resonant inverter employs a phase modulation scheme as the control scheme for the switch network of a resonant inverter. This approach is suited for high and very high frequency operation of resonant converters, for example up to tens of MHz.

15 Claims, 3 Drawing Sheets

(51) Int. Cl.
*H02M 7/537* (2006.01)
*H03L 7/093* (2006.01)
*H03L 7/099* (2006.01)
*H05B 45/355* (2020.01)

(52) U.S. Cl.
CPC ............ *H02M 7/537* (2013.01); *H03L 7/093* (2013.01); *H03L 7/099* (2013.01)

(56) References Cited

FOREIGN PATENT DOCUMENTS

| | | | |
|---|---|---|---|
| JP | 2013158241 | A | 8/2013 |
| WO | 2017167640 | A1 | 10/2017 |

* cited by examiner

RESONANT INVERTER AND CONVERSION METHOD

CROSS-REFERENCE TO PRIOR APPLICATIONS

This application is the U.S. National Phase application under 35 U.S.C. § 371 of International Application No. PCT/EP2021/052231, filed on Feb. 1, 2021, which claims the benefit of European Patent Application No. 20155438.3, filed on Feb. 4, 2020. These applications are hereby incorporated by reference herein.

FIELD OF THE INVENTION

The present invention relates to the field of resonant inverters, and in particular to resonant inverters for use in a resonant converter.

BACKGROUND OF THE INVENTION

Resonant converters having a series or parallel resonant circuit are well known. For example, resonant LLC converters are well known for use within LED drivers. Such converters have the advantage that energy-efficient operation with relatively low switching losses is possible.

A resonant converter can be configured or operated as a constant current source or a constant voltage source. A constant current source can be used to drive an LED arrangement directly, thus enabling a single stage driver. Constant voltage sources can be used, for example, for LED modules which have further driver electronics in order to ensure a corresponding power supply to the LEDs with a predetermined current, derived from the output voltage provided by the constant voltage source.

An LLC converter comprises a switching arrangement (called the inverter switch) for controlling the conversion operation, and the switching is controlled using feedback or feedforward control, in order to generate the required output.

Another function implemented within a power converter which is supplied with mains (or other AC) power is power factor correction (PFC). The power factor of an AC electrical power system is defined as the ratio of the real power flowing to the load to the apparent power in the circuit. A power factor of less than one means that the voltage and current waveforms are not in phase, reducing the instantaneous product of the two waveforms. The real power is the capacity of the circuit for performing work in a particular time. The apparent power is the product of the current and voltage of the circuit. Due to energy stored in the load and returned to the source, or due to a non-linear load that distorts the wave shape of the current drawn from the source, the apparent power will be greater than the real power.

If a power supply is operating at a low power factor, a load will draw more current for the same amount of useful power transferred than for a higher power factor.

The power factor can be increased using power factor correction. For linear loads, this may involve the use of a passive network of capacitors or inductors. Non-linear loads typically require active power factor correction to counteract the distortion and raise the power factor.

Passive PFC brings the power factor of the AC power circuit closer to 1 by supplying reactive power of opposite sign, adding capacitors or inductors that act to cancel the inductive or capacitive effects of the load.

Active PFC makes use of power electronics to change the waveform of the current drawn by a load to improve the power factor. Active PFC circuits may for example be based on buck, boost or buck-boost switched mode converter topologies. Active power factor correction can be single-stage or multi-stage.

In the case of a switched mode power supply, a PFC boost converter is for example inserted between the bridge rectifier and the mains storage capacitor. The boost converter attempts to maintain a constant DC bus voltage on its output while drawing a current that is always in phase with and at the same frequency as the line voltage. Another switched-mode converter inside the power supply produces the desired output voltage or current from the DC bus.

Power factor correction may be implemented in a dedicated power factor correction circuit (called a pre-regulator), for example placed between the (mains) power supply and the switch mode power converter which then drives the load. This forms a dual stage system, and this is the typical configuration for high power LED applications (for example more than 25 W).

The power factor correction may instead be integrated into the switch mode power converter, which then forms a single stage system. In this case, there is a single resonant tank and switching arrangement, which then implements both power factor correction as well as control of the conversion ratio between the input and output in order to maintain the desired output (current in the case of an LED driver) delivered to the load.

Active power factor correction typically involves providing the input current and voltage waveforms to a controller so that their relative phase angle may be controlled by adjusting the load.

It has been proposed in US 2014/0091718 to use an LLC DC/DC converter, preceded by a rectifier, as a PFC circuit. The LLC resonant converter is frequency controlled, for which an oscillator is used. The control value of the feedback control system is the switching frequency of the inverter. Resonant power converters are indeed typically feedback-controlled with the switching frequency used as the manipulating value.

Self-oscillating resonant converter circuits are also known which make use of internal components to form a resonant tank. More recently, threshold-based control schemes have been proposed to overcome control stability issues related to high gain ratios as needed e.g. for the resonant LLC converter operating as PFC front end. Signal values (e.g. voltage levels which arise in the circuit) are then used to implement switching operations. For example, U.S. Pat. No. 8,729,830 discloses the control of a resonant DC/DC converter in a self-oscillating manner, by using threshold detection of states in the resonant tank in order to determine the inverter switching times rather than employing an oscillator and frequency control.

However, these threshold-based approaches become impractical at higher frequencies for example above 0.5 MHz mainly due to the efforts needed to compensate for delays and inaccuracies resulting from the threshold sensing as well as noise.

There is thus an ongoing desire to improve the operation of resonant converters, and in particular, to improve the power factor of a resonant converter when it acts as a power factor correction (PFC) circuit.

SUMMARY OF THE INVENTION

The invention is defined by the claims.

According to examples in accordance with an aspect of the invention, there is provided a resonant inverter, comprising:
  an input node for receiving an input for conversion;
  a switch network, connected to the input node, comprising at least a first and second switch, wherein the switch network is controlled by a switching signal, and wherein a switch network output is defined at a node located between the first and second switches, wherein the switch network is adapted to provide a feedback signal comprising a phase signal representing the phase of the switching signal;
  a resonant tank circuit coupled to the switch network output, wherein the resonant tank circuit adapted to provide a feedback signal comprising a resonance voltage across a circuit element of the resonant tank circuit; a current setting unit, for setting a reference current to be drawn from the input node;
  a phase setting unit, for setting a reference phase, based on the reference current; and
  a phase control circuit for generating the switching signal for the switch network, based on a phase difference between the resonance voltage and the phase signal and based on the reference phase.

This resonant inverter employs a phase modulation scheme as the control scheme for the switch network of a resonant inverter. This approach is for example suitable for operation at all frequencies including high and very high frequency operation of resonant converters, for example up to tens of MHz. A phase difference is measured, the phase between the inverter voltage and a resonant tank signal is controlled (e.g. a resonant capacitor voltage) to follow a phase reference. The phase signal to be measured is far less sensitive to noise than threshold signals. The inverter can be implemented with low-cost ICs (e.g. clock buffers, frequency modulation demodulator circuits) with only a small requirement for additional external circuitry.

The inverter may be used as part of an ac/dc converter with power factor correction or as part of a dc/dc converter.

The phase control circuit for example comprises a phase locked loop. This provides a simple and low cost phase control approach. The phase control circuit for example comprises a phase detector for detecting a phase difference between the resonant voltage and the phase signal.

The phase control circuit may comprise:
  a loop filter for filtering a difference between the phase difference signal and the reference phase; and
  a voltage controlled oscillator driven by the output from the loop filter.

The loop filter may for example be a PID filter.

In one example, the resonant tank comprises an LLC circuit. Other resonant converters may however be implemented such as LCC or other resonant converters.

For the example of an LLC circuit, the resonance voltage may be the voltage across a capacitor of the LLC circuit. The feedback signal will depend on the type of resonant converter. For example, for an LCC converter the voltage across the series resonant capacitor can be used in the same manner as for the LLC converter.

The phase signal is for example a voltage across the first or second switch.

As mentioned above, the resonant inverter of the invention is of particular interest for high frequency operation. For example, the frequency of the switching signal may be at least 0.5 MHz.

The resonant tank circuit is for example adapted to provide a further feedback signal comprising an output voltage, and the current setting unit is for setting the reference current based at least on the output voltage. This enables feedback control of the output voltage (e.g. of a dc/dc converter), or it enables power factor correction by taking account of the shape of the output voltage.

The resonant inverter may be further adapted to provide a further feedback signal comprising an input current drawn from the input node, and the phase setting unit is for setting the reference phase based on the input current and the reference current. This enables feedback control of the output current (e.g. of a dc/dc converter), or again it may form part of a power factor correction function.

The first and second switches for example form a half bridge inverter.

The invention also provides an AC/DC PFC converter comprising:
  an AC input;
  a rectifier, wherein the AC input is coupled to an input of the rectifier; and
  a converter as defined above, having as its input an output of the rectifier.

The invention also provides an apparatus comprising:
  the inverter as defined above; and
  a load downstream of the inverter, such as an LED arrangement of one or more LEDs.

The LED arrangement may for example by provided after a further output stage for adapting the output of the converter to the LED arrangement.

The invention also provides a conversion method comprising:
  receiving an input for conversion;
  controlling a switch network using a switching signal, the switch network comprising at least a first and second switch with a switch network output defined at a node located between the first and second switches;
  providing a feedback signal from the switch network comprising a phase signal representing the phase of the switching signal;
  providing the output of the switch network to a resonant tank circuit;
  providing a feedback signal from the resonant tank circuit comprising a resonant voltage across an element of the resonant tank circuit;
  setting a reference current to be drawn from the input node;
  setting a reference phase, based on the reference current; and
  generating the switching signal for the switch network, based on a phase difference between the resonant voltage and the phase signal, and based on the reference phase.

The method may further comprise:
  providing a further feedback signal comprising an input current drawn from the input node, and wherein setting the reference phase is based on the input current and the reference current; and/or
  providing a further feedback signal comprising an output voltage, and wherein setting the reference current is based at least on the output voltage.

The invention also provides an LED driving method comprising rectifying an AC input, and providing conversion using the method defined above to implement power factor correction, and driving an LED load based on the converted DC voltage.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
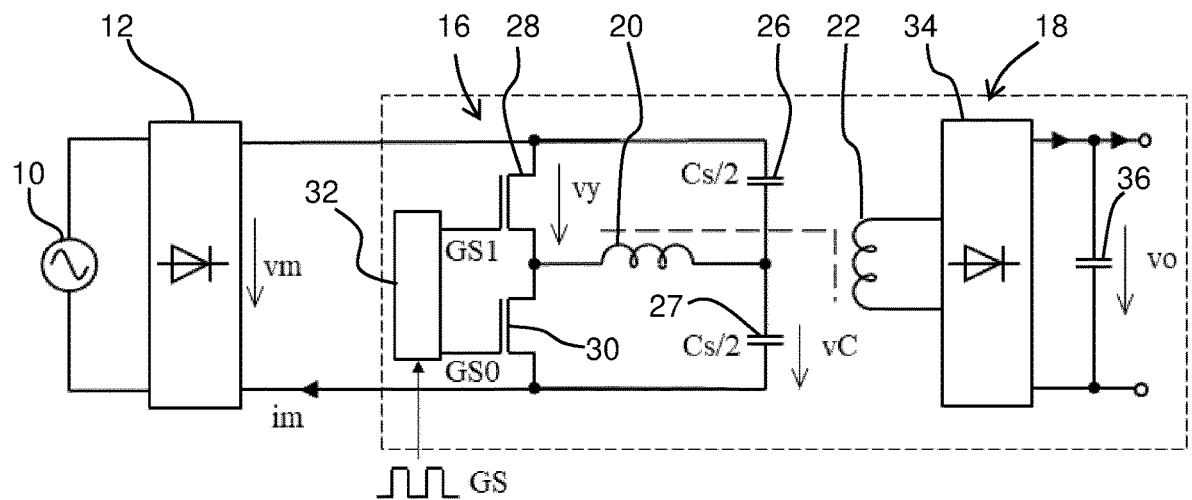
FIG. 1 shows an example of a resonant AC/DC converter.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a resonant inverter which has a switch network from which a phase signal is provided representing the phase of the switching signal. A resonant tank circuit is coupled to the first switch network output and provides a feedback signal of a resonance voltage across a circuit element of the resonant tank circuit. A reference current to be drawn from the input node is set and a reference phase is set based on the reference current. The switching signal for the switch network is controlled based on a phase difference between the resonance voltage and the phase signal, and based on the reference phase. This resonant inverter thus employs a phase modulation scheme as the control scheme for the switch network of a resonant inverter. This approach is suited for high and very high frequency operation of resonant converters, for example up to tens of MHz.

An example of a resonant AC/DC converter is shown in FIG. 1. The LLC resonant circuit forms a PFC stage and may thus be used as a PFC pre-regulator by having a controlled output voltage. It could also be used as a single stage LED driver by having a controlled output current.

The circuit comprises a mains input 10 which is followed by a rectifier bridge 12 (for example having a smoothing capacitor at its output).

The converter comprises a primary-side circuit 16 and a secondary side 18. There may be electrical isolation between the primary-side circuit 16 and the secondary side 18. A transformer comprising a primary coil 20 and a secondary coil 22 is provided for the isolation. The primary coil 20 has a magnetizing inductance which also acts as one of the inductances of a series LLC resonant circuit. The LLC resonant circuit for example has a second inductance (so that the coil 20 represents two inductors), and a capacitance (formed as two capacitors 26 and 27 in this example).

In an LLC circuit, the inductances and capacitor may be in any series order. The inductor may comprise discrete components or it may be implemented as leakage inductances of the transformer.

The primary-side circuit 16 comprises a half-bridge having a first power switch 28 and a second power switch 30. The first switch and the second switch can be identical, and the half-bridge can be in the form of a symmetrical half-bridge (with symmetrical duty cycle). The invention is not however limited to a symmetric duty cycle. These switches can be in the form of field-effect transistors. The resonant LLC circuit is connected to a node between the two switches.

Each switch has its timing of operation controlled by its respective gate voltage GS0 and GS1 delivered by a controller 32. Feedback is used to determine the timing of the control of the switches 28, 30.

During operation of the converter, the controller 32 controls the switches, at a particular frequency and in complementary manner. The two gate voltages may be derived from a single gate control signal GS.

In summary, the circuit shown in FIG. 1 is thus an AC/DC PFC single stage converter, comprising an AC input 10, a rectifier 12, a half bridge inverter comprising a high side switch (the first power switch 28) and a low side switch (the second power switch 30), wherein an output is defined from a node between the switches. The self-oscillating LLC circuit is coupled to the output. The controller is used for generating the gate drive signal GS for controlling the switching of the high side and low side switches. A high gate drive signal turns on one switch and turns off the other switch and a low gate drive signal turns off the one switch and turns on the other switch.

In one known approach, the primary-side circuit 16 detects a variable which indicates an average value over time of a current flowing in the circuit, for example through the first or second switch. Information about the load is derived on the basis of the measured current in the primary-side circuit. The measured current may have a direct relationship with the load.

The secondary side 18 has a rectifier 34 which is connected downstream of the secondary coil 22. The rectifier may be a full-bridge rectifier (e.g. a diode bridge) and a single secondary coil may be used, which couples at its ends to the rectifier circuit. Instead, a center of the secondary coil 22 may be coupled to an output of the secondary-side circuit. The ends of the secondary coil 22 may then be coupled to the output via a half bridge rectifier with only two diodes.

A storage capacitor 36 is connected between the outputs of the rectifier across which the output voltage vo is delivered. The LED load or other output stage is connected to the output, either directly or though a further output circuit. An LED load may comprise an LED or a plurality of LEDs or a LASER diode or a plurality of LASER diodes.

A control scheme is required to drive the switches 28, 30 into their on- and off-states such that the output voltage or current is regulated to a certain desired value or range of values and for a PFC circuit also to implement power factor correction.

In order to exploit best the powertrain and to achieve the maximum efficiency, it is desired to operate the converter symmetrically (at least at full load) and to load the transformer and the rectifier in the secondary side equally. In the case of a transformer with center-tapped output windings that are symmetric in terms of turn-ratios and leakages, secondary side symmetry can be assured if the duty cycle of the half-bridge (i.e., its switch node) is kept at 50%.

The control of the converter aims to maintain a given output voltage vo and to render a mains current im proportional to the mains voltage vm. Various ways targeting this approach have been described.

Direct Frequency Control

The standard approach of controlling resonant converters uses the switching frequency (i.e. the oscillator frequency) as the immediate manipulating variable of the feedback system controlling e.g. the converter input current.

Figure 2:
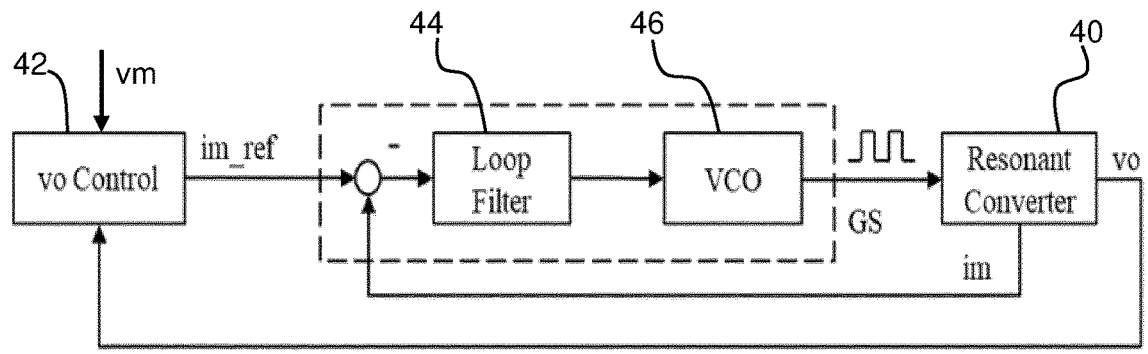
FIG. 2 shows a known example of oscillator frequency control.

FIG. 2 shows an example of oscillator frequency control, with the resonant converter of FIG. 1 as a single unit 40, and the figure shows the circuit for generating the gate signal GS.

The output voltage vo is provided to a current setting unit 42, which converts the output voltage to a reference input current im_ref. The reference input current is also based on the mains input voltage (vm in FIG. 1), which gives the shape which the current has to follow to render a unity power factor. The reference input current is compared with a measured input current im and the difference is filtered by loop filter 44. The output of the loop filter controls the voltage controlled oscillator VCO 46, which in turn generates the gate signal GS.

Thus, the current is used as feedback control parameter, with the target current set based on the desired output voltage.

A problem with this approach is that it is difficult to avoid control instabilities if the converter must cope with relatively large gain ratios (i.e., the variation of the output to input voltage ratio is large). These instabilities are caused by the largely varying steepness of the voltage gain vs. frequency characteristic as is typical for resonant converters.

As an example, for an LLC converter in a PFC application, the problem is more pronounced the closer the converter is operating to the mains zero, which however is needed to render a high power factor in terms of a low total harmonic distortion.

Threshold Control

There are various threshold control schemes which all make use of the situation that a converter state variable (e.g. the resonant tank capacitor voltage vC) at the inverter switching instant is linearly related to the converted energy per switching cycle.

Figure 3:
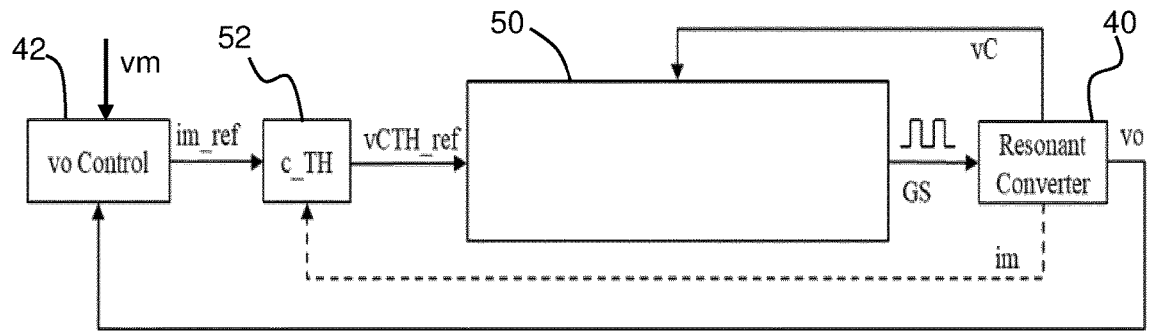
FIG. 3 shows a known example of threshold control.

FIG. 3 shows an example of threshold control, again with the resonant converter of FIG. 1 represented as a single unit 40, and the figure shows the circuit for generating the gate signal GS.

The converter state variable is the capacitor voltage vC and it is provided to a control unit 50.

The output voltage vo is again converted to target current im_ref in unit 42 and this is in turn converted to a target value for the converter state variable, the capacitor voltage in this example. The target is shown as vCTH_ref. This takes place in unit 52.

There may or may not be a current feedback path for the current im as indicated with a dashed line.

Direct Threshold Control

In this case, the inverter is commutated in direct response to a threshold detection. This scheme does not require an oscillator and is referred to as "self-oscillating". U.S. Pat. No. 8,729,830 provides an example.

The instabilities of the frequency control can be overcome by this scheme since it directly controls the conversion energy. However, the threshold detection is susceptible to noise which can lead to abrupt discontinuation of the (self-) oscillation.

Cascaded Threshold Control

The threshold control can be cascaded by adding an additional inner loop. In such a case, the inverter is actuated again by an oscillator which in turn is manipulated by the threshold control.

The issue of noise is overcome due to the (re-) introduction of an oscillator, but the direct power control approach related to threshold control is maintained. However, the reliable threshold sensing requires considerable circuit efforts (in terms of cost, size and complexity) and is no longer practical at higher frequencies above about 0.5 MHz.

Figure 4:
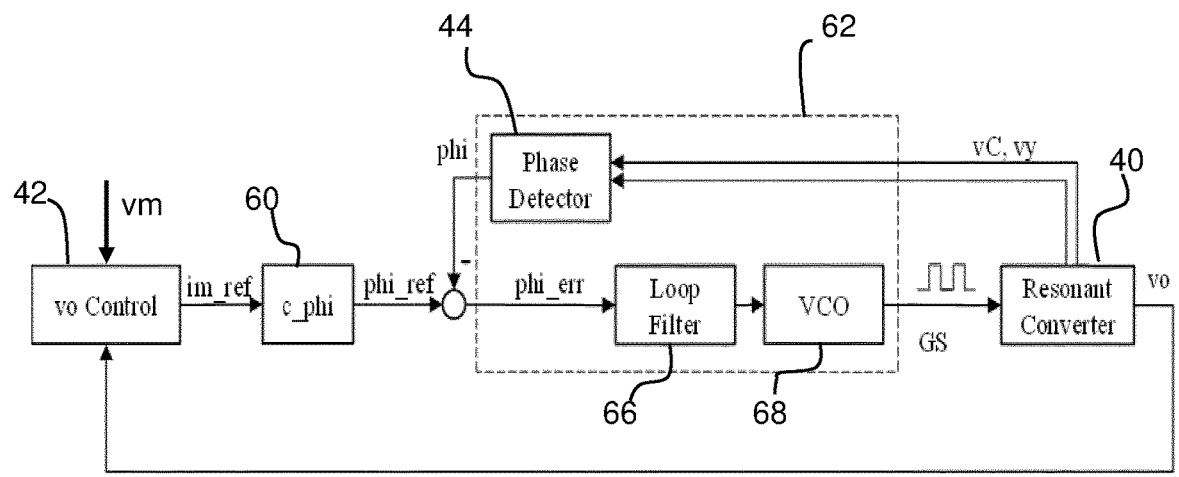
FIG. 4 shows a first example of a circuit in accordance with the invention.

FIG. 4 shows a first example of a circuit in accordance with the invention. The resonant converter of FIG. 1 is again shown as a single unit 40, and the figure shows the circuit for generating the gate signal GS.

The control variable is a phase lag signal phi.

The output voltage vo is again used (in combination with the input voltage) to generate a target current im_ref in a current setting unit 42 and this is in turn converted to a target value for the phase difference, i.e. phase lag, phi_ref. This takes place in a phase setting unit 60.

A phase control circuit 62 generates the feedback phase difference, i.e. phase lag, signal phi.

The switch network within the resonant converter 40 provides a feedback signal vy which is a phase signal representing the phase of the switching signal.

The resonant tank of the resonant converter 40 provides a further feedback signal comprising a resonance voltage vC across a circuit element of the resonant tank circuit. In addition, in this example, the output voltage vo is provided as a further feedback signal.

The current setting unit 42 sets a reference current to be drawn from the input node, in this example based on the output voltage vo and the input voltage vm. The phase setting unit 60 sets the reference phase difference (i.e. reference phase lag) phi_ref, based on the reference current im_ref.

The phase control circuit 62 has a phase detector 64 that detects a phase difference between the resonance voltage vC and the phase signal vy. The phase difference is compared to the reference phase difference phi_ref and from the difference a phase error phi_err is derived.

This phase error is applied to a loop filter 66 and the output of the loop filter drives a VCO 68 to derive the gate signal GS.

The resonant inverter thus employs a phase modulation scheme as the control scheme for the switch network of the resonant inverter. This approach is suited for high and very high frequency operation of resonant converters, for example up to tens of MHz. The measured phase difference signal is far less sensitive to noise than threshold signals.

The circuit of FIG. 4 can render a high power factor without using a mains current measurement. The known relation between the mains current and phase may be used to avoid the measurement of the mains current. The circuit controls in a closed loop the phase lag phi between the state variable of the resonant tank (vC in this example) and a voltage related to the inverter switching state vy.

In the example of FIG. 4, the state variable is the resonant capacitor voltage vC and the voltage vy is the voltage across the upper switch of the inverter. In the case of a full bridge inverter (i.e. a second half-bridge inverter is employed), vy can be the voltage across the lower switch of the second half-bridge.

Alternatively, the gate driving signal GS0 can be used as the reference signal for processing the phase lag phi.

The voltages can be measured by means of capacitive dividers and the phase detector preferably has self-biasing inputs, which helps to cope better with varying amplitudes of the two measured signals.

If the input current im is too high, this translates to a lower reference phase lag phi, which in turn would result in a higher VCO input voltage meaning a lower conversion power and thus a lower current (and vice versa).

Figure 5:
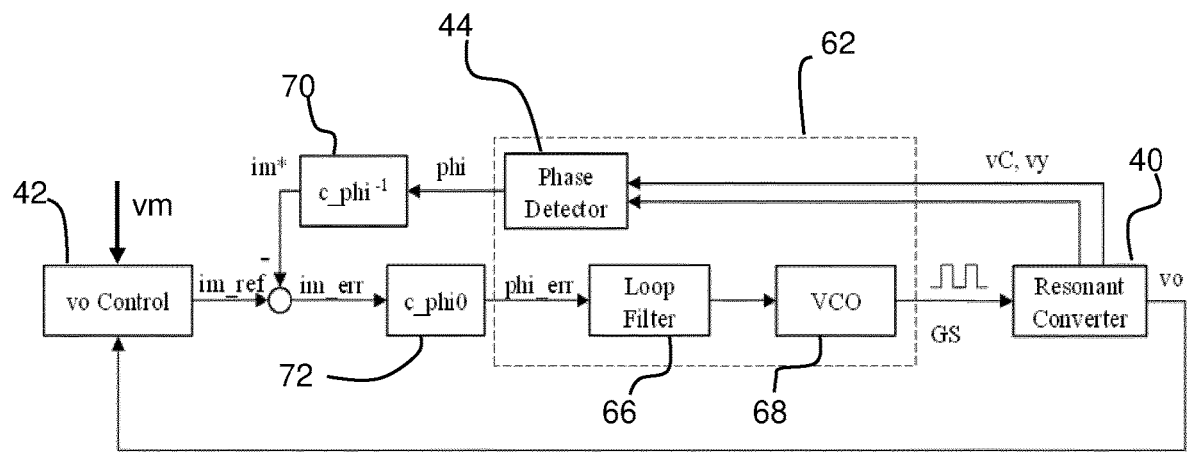
FIG. 5 shows a first modification to FIG. 4.

FIG. 5 shows a modification to FIG. 4, in which the phase difference phi is converted to an input current value im* by unit 70. The repeated components from FIG. 4 are not described.

The subtraction step of the feedback control is then between the reference current im_ref and the input current value im*. An input current error im_err then results. It is converted to a phase difference error phi_err in unit 72.

In FIG. 5, the relation of mains current and phase is inversely applied to generate a modelled (or observed) mains current im* in place of a really measured one. The resulting current error is proportional to the phase error and controlled in the same manner as in FIG. 4.

Figure 6:
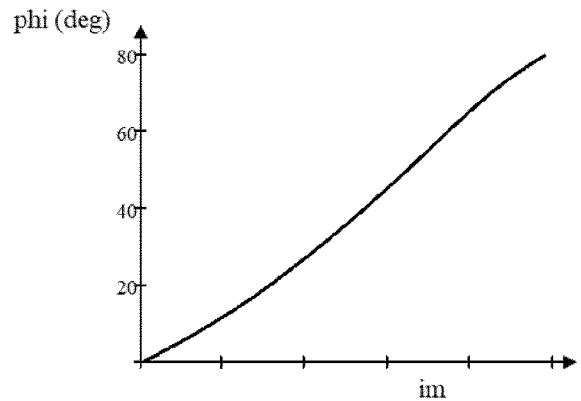
FIG. 6 shows the known relation between phase difference and current.

As explained above, the examples of FIGS. 4 and 5 avoid the need for mains current measurement, relying on a known relation between the phase difference (phase lag) and current. FIG. 6 shows this relationship for an example resonant converter. The relative linearity shown between the mains current im and the phase lag phi still allows a high power factor of e.g., above 0.9 to be achieved.

Figure 7:
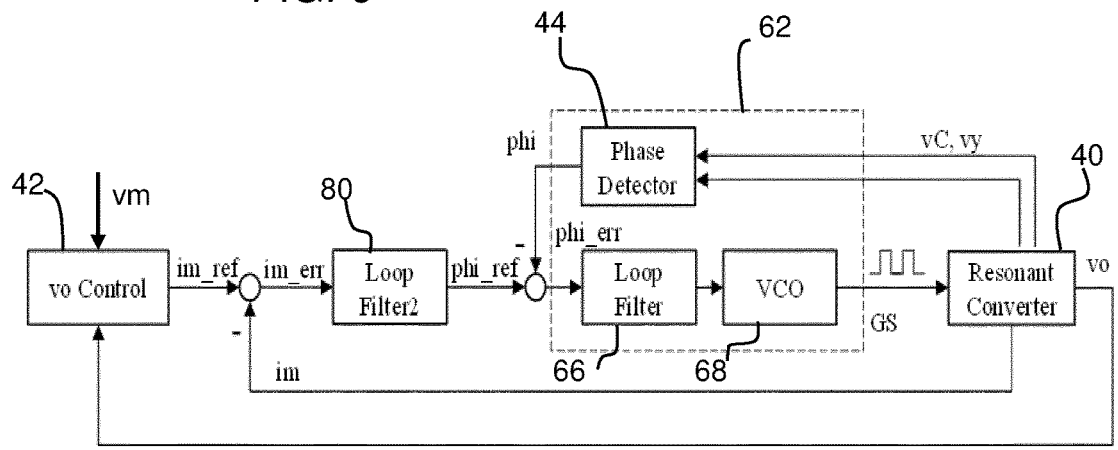
FIG. 7 shows a second modification to FIG. 4.

FIG. 7 shows an alternative design, shown as an alternative modification to FIG. 4, in which the mains current is measured.

The repeated components from FIG. 4 are not described.

The mains current measurement signal im is subtracted from the reference current im at the output of the current setting unit 42. This results in a current error im_err which is provided to an extra control loop in the form of the loop filter 80. It generates the reference phase difference phi_ref, which is then processed in the same way as in FIG. 4.

The phase difference remains the inner feedback control parameter, hence there is an (inner) phase control loop.

Figure 8:
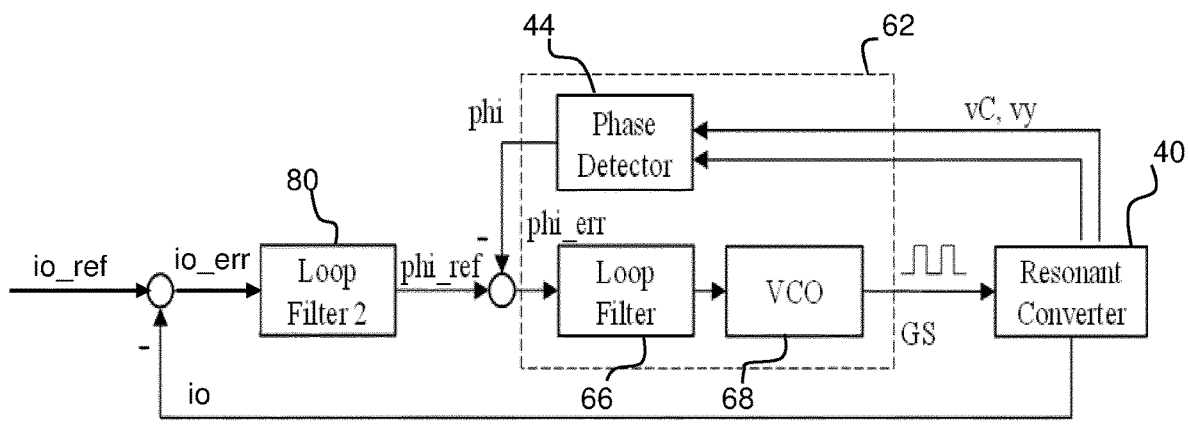
FIG. 8 shows a third modification to FIG. 4 for a dc-dc converter.

FIG. 8 shows a dc-dc converter (hence without a PFC function) controlling its output current io. The inner current control loop is unchanged compared to FIG. 7. The modulation of the reference current io_ref based on the output voltage is removed (i.e. unit 42 of FIG. 7), since the converter no longer implements power factor correction. This circuit may for example be used as an isolated output stage of an LED driver. The same inner control loop may instead be used for controlling the output voltage.

By way of example, an HC4046 voltage controlled oscillator circuit may be used as the phase control circuit 62 (including the phase detector and the VCO, and to which the loop filter may be connected). This circuit generates a signal proportional to the phase lag.

This type of phase detector IC is for example designed to control the phase difference between the inputs to be zero. However, such circuits can also be used to control the phase difference to exhibit any given reference value. The circuit comprises self-biasing inputs (SIG_IN and COMP_IN) as well as a phase comparator and a VCO. It is designed to enable addition of a loop filter as well as forming the control error difference with a reference phase lag. Such circuits are available for various frequency ranges up to tens of MHz.

The phase detector can instead be realized e.g., by an EXOR detector, a positive edge-triggered phase and frequency detector or a positive edge-triggered sequential phase detector. The phase detector and the VCO may also be realized by discrete (non-integrated) circuits.

Delays in the control such those related to sensing, signal conditioning or gate driving are almost constant over time and can easily be compensated for. These delays for example introduce an offset in the relationship shown in FIG. 6, i.e., the curve is then shifted up or down depending on the overall delays of both inputs of the phase detector.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

A single processor or other unit may fulfill the functions of several items recited in the claims.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A resonant inverter, comprising:
   an input node for receiving an input for conversion;
   a switch network, connected to the input node, comprising at least a first and second switch, wherein the switch network is controlled by a switching signal, and wherein a switch network output is defined at a node located between the first and second switches, wherein the switch network is adapted to provide a feedback signal comprising a phase signal representing a phase of the switching signal;
   a resonant tank circuit coupled to the switch network output, wherein the resonant tank circuit is adapted to provide a feedback signal comprising a resonance voltage across a circuit element of the resonant tank circuit;
   a current setting unit, for setting a reference current to be drawn from the input node;
   a phase setting unit, for setting a reference phase, based on the reference current; and
   a phase control circuit for generating the switching signal for the switch network, based on a phase difference between the resonance voltage and the phase signal and based on the reference phase.

2. The resonant inverter as claimed in claim 1, wherein the phase control circuit comprises a phase locked loop.

3. The resonant inverter as claimed in claim 1, wherein the phase control circuit comprises a phase detector for detecting the phase difference between the resonant voltage and the phase signal.

4. The resonant inverter as claimed in claim 1, wherein the phase control circuit comprises:
   a loop filter for filtering a difference between a phase difference signal and the reference phase; and a voltage controlled oscillator driven by a output from the loop filter.

5. The resonant inverter as claimed in claim 1, wherein the resonant tank comprises an LLC circuit.

6. The resonant inverter as claimed in claim 5, wherein the resonance voltage is a voltage across a capacitor of the LLC circuit.

7. The resonant inverter as claimed in claim 1, wherein the phase signal is a voltage across the first or second switch.

8. The resonant inverter as claimed in claim 1, wherein the first and second switches form a half bridge inverter.

9. The resonant inverter as claimed in claim 1, further adapted to provide, as a further feedback signal, an input current drawn from the input node and wherein the phase setting unit is for setting the reference phase based on the input current and the reference current.

10. The resonant inverter as claimed in claim 1, wherein the resonant tank circuit is adapted to provide a further feedback signal comprising an output voltage, and wherein the current setting unit is for setting the reference current based at least on the output voltage.

11. An AC/DC PFC converter comprising:

an AC input;

a rectifier, wherein the AC input is coupled to an input of the rectifier; and the resonant inverter as claimed in claim 10, having as its input an output of the rectifier.

12. An apparatus comprising:

the resonant inverter as claimed in claim 1; and a load downstream of the inverter, such as an LED arrangement of one or more LEDs.

13. A conversion method comprising:

receiving an input for conversion;

controlling a switch network using a switching signal, the switch network comprising at least a first and second switch with a switch network output defined at a node located between the first and second switches;

providing a feedback signal from the switch network comprising a phase signal representing a phase of the switching signal;

providing the output of the switch network to a resonant tank circuit;

providing a feedback signal from the resonant tank circuit comprising a resonant voltage across an element of the resonant tank circuit;

setting a reference current to be drawn from an input node;

setting a reference phase, based on the reference current; and generating the switching signal for the switch network, based on a phase difference between the resonant voltage and the phase signal, and based on the reference phase.

14. The method as claimed in claim 13, further comprising:

providing a further feedback signal comprising an input current drawn from the input node, and wherein setting the reference phase is based on the input current and the reference current; and/or providing a further feedback signal comprising an output voltage, and wherein setting the reference current is based at least on the output voltage.

15. An LED driving method comprising rectifying an AC input, and providing conversion using the method of claim 13 to implement power factor correction, and driving an LED load based on converted DC voltage.

* * * * *